(12) United States Patent
Masuda et al.

(10) Patent No.: US 9,375,972 B2
(45) Date of Patent: Jun. 28, 2016

(54) WRITING INSTRUMENT

(71) Applicant: KABUSHIKI KAISHA PILOT CORPORATION, Tokyo-to (JP)

(72) Inventors: Hirotaka Masuda, Kanagawa-ken (JP); Naoto Masushige, Aichi-ken (JP)

(73) Assignee: KABUSHIKI KAISHA PILOT CORPORATION, Tokyo-To (JP)

( * ) Notice: Subject to any disclaimer, the term of this patent is extended or adjusted under 35 U.S.C. 154(b) by 0 days.

(21) Appl. No.: 14/380,951

(22) PCT Filed: Feb. 19, 2013

(86) PCT No.: PCT/JP2013/053953
§ 371 (c)(1),
(2) Date: Aug. 26, 2014

(87) PCT Pub. No.: WO2013/129178
PCT Pub. Date: Sep. 6, 2013

(65) Prior Publication Data
US 2015/0298488 A1  Oct. 22, 2015

(30) Foreign Application Priority Data

Feb. 27, 2012  (JP) ................. 2012-040346

(51) Int. Cl.
*B43K 5/16* (2006.01)
*B43K 7/10* (2006.01)
(Continued)

(52) U.S. Cl.
CPC ... *B43K 7/10* (2013.01); *B43K 1/08* (2013.01); *B43K 1/082* (2013.01); *B43K 1/084* (2013.01); *B43K 7/00* (2013.01); *B43K 7/005* (2013.01); *B43K 7/02* (2013.01); *B43K 7/06* (2013.01);
(Continued)

(58) Field of Classification Search
CPC ................................... B43K 7/10; B43K 1/08
USPC ........................................ 401/216, 208–215
See application file for complete search history.

(56) References Cited

U.S. PATENT DOCUMENTS

| 6,077,572 | A | 6/2000 | Hopwood et al. |
| 7,168,105 | B2 * | 1/2007 | Adelman ............... B43K 5/005 401/195 |

(Continued)

FOREIGN PATENT DOCUMENTS

| JP | 2001-121868 | 5/2001 |
| JP | 2001121868 A * | 5/2001 |

(Continued)

OTHER PUBLICATIONS

Supplementary European Search Report dated Sep. 25, 2015 issued in corresponding European Patent Application No. 13754103.3.
(Continued)

*Primary Examiner* — Mark A Laurenzi
*Assistant Examiner* — Thomas M Abebe
(74) *Attorney, Agent, or Firm* — Wenderoth, Lind & Ponack, L.L.P.

(57) ABSTRACT

A writing instrument includes a pen point retaining member, a pen point that is attached to a first end of the pen point retaining member, an ink tank that is attached to a second end of the pen point retaining member, and an ink that is accommodated in the ink tank. The ink includes a lubricating interface layer-forming compound, and a carbonaceous film is formed on at least one of a surface of the ball or a contact portion of the ball holding portion with the ball.

9 Claims, 2 Drawing Sheets

(51) Int. Cl.
*B43K 29/00* (2006.01)
*B43K 7/02* (2006.01)
*B43K 7/06* (2006.01)
*B43K 1/08* (2006.01)
*B43K 7/00* (2006.01)
*C22C 29/08* (2006.01)
*C23C 16/02* (2006.01)
*C23C 16/26* (2006.01)
*C23C 16/56* (2006.01)
*C09D 11/18* (2006.01)

(52) U.S. Cl.
CPC ............. *B43K 7/105* (2013.01); *C09D 11/18* (2013.01); *C22C 29/08* (2013.01); *C23C 16/0272* (2013.01); *C23C 16/26* (2013.01); *C23C 16/56* (2013.01)

(56) References Cited

U.S. PATENT DOCUMENTS

| | | | | |
|---|---|---|---|---|
| 7,208,036 B2* | 4/2007 | Fukuo | ............ | B43K 8/02 106/31.65 |
| 7,387,835 B2* | 6/2008 | Fujita | ............ | C01B 31/04 428/408 |
| 8,403,579 B2* | 3/2013 | Kitaoka | ............ | B43K 7/02 106/31.13 |
| 8,430,591 B1* | 4/2013 | Okamoto | ............ | B43K 7/02 401/215 |
| 2003/0152412 A1* | 8/2003 | Rosso | ............ | B43K 232/02 401/131 |
| 2005/0079359 A1* | 4/2005 | Fujita | ............ | C04B 35/536 428/408 |
| 2006/0188321 A1* | 8/2006 | Nakamura | ............ | B43K 1/08 401/214 |
| 2007/0123607 A1* | 5/2007 | King | ............ | C09D 11/322 523/160 |
| 2007/0189836 A1* | 8/2007 | Senga | ............ | B43K 1/086 401/195 |
| 2011/0008095 A1* | 1/2011 | Fujita | ............ | C09D 11/17 401/198 |
| 2014/0321898 A1* | 10/2014 | Kunz | ............ | A45D 40/261 401/213 |
| 2015/0023720 A1* | 1/2015 | Fujii | ............ | B43K 7/02 401/209 |

FOREIGN PATENT DOCUMENTS

| | | |
|---|---|---|
| JP | 2002-505716 | 2/2002 |
| JP | 2003-196819 | 7/2003 |
| JP | 2004-338134 | 12/2004 |
| JP | 2004338134 A * | 12/2004 |
| JP | 2005-324336 | 11/2005 |
| JP | 2010-240931 | 10/2010 |
| JP | 2012-12329 | 1/2012 |
| JP | 2012-56198 | 3/2012 |

OTHER PUBLICATIONS

English translation of International Preliminary Report on Patentability issued Sep. 12, 2014 in International (PCT) Application No. PCT/JP2013/053953.

International Search Report (ISR) issued May 21, 2013 in International (PCT) Application No. PCT/JP2013/053953.

* cited by examiner

WRITING INSTRUMENT

TECHNICAL FIELD

The present invention relates to writing instruments. Specifically, the present invention relates to a writing instrument including a pen point retaining member, a pen point that is attached to a first end of the pen point retaining member, an ink tank that is attached to a second end of the pen point retaining member, and an ink that is accommodated in the ink tank.

BACKGROUND ART

There has been conventionally known a ball-point pen, in which an ink tank in which an ink for a ball-point pen is accommodated is disposed in a shaft cylinder, and a ball is put on the bottom wall of a ball holding portion, and which includes a pen point of which the leading end portion is inwardly crimped, whereby a part of the ball is allowed to protrude from the leading edge of the pen point, and the ball is rotatably held.

A ball-point pen performs writing by transferring ink, flowing out of an ink tank, onto a body to be recorded, such as paper, or by allowing the ink to infiltrate into the body to be recorded, due to rotation of a ball. The wear of the ball and the inner surface of a ball holding portion prevents the ball from smoothly rotating, results in great deterioration of writing characteristics, and finally precludes writing. Therefore, the reduction of the wear of the ball and the ball holding portion is an important problem.

Use of a ceramic ball, coating of the surface of a metallic ball with a rigid material such as a diamond-like carbon film for reducing the wear of the ball and the ball holding portion (for example, Patent Literature 1), and the like have been attempted with respect to such problems. Coating of the surface of not only the ball but also the ball holding portion with a rigid material for reducing the wear of the ball holding portion by the ball has been also attempted.

CITATION LIST

Patent Literature

Patent Literature 1: Japanese Patent Laid-Open No. 2004-338134

SUMMARY OF INVENTION

Technical Problem

However, even when only the hardness of a ball or a ball holding portion is increased as in Patent Literature 1, it is difficult to prevent the ball and the ball holding portion from being worn to realize sufficient durability. This is because when the contact site between the ball and the ball holding portion is microscopically observed, the contact site may be in the state of boundary lubrication in which the ball and the ball holding portion come into direct contact with each other without the existence of an ink for a writing instrument in the interface between the ball and the ball holding portion. Such a phenomenon has tended to be prone to occur particularly when an ink having low viscosity has been used.

A state in which an appropriate amount of ink is present on the interface between the ball and the ball holding portion, and the ball and the ball holding portion do not come into direct contact with each other is important for reducing such wear of the ball and the ball holding portion.

Solution to Problem

The writing instrument according to the present invention is a writing instrument including:
a pen point retaining member;
a pen point that includes a ball and a ball holding portion that rotatably holds the ball, and is attached to a first end of the pen point retaining member;
an ink tank that is attached to a second end of the pen point retaining member; and
an ink for a writing instrument that is accommodated in the ink tank and includes a lubricating interface layer-forming compound,
wherein a carbonaceous film is formed on at least one of a surface of the ball or a contact portion of the ball holding portion with the ball; and the carbonaceous film includes a carbon atom and an oxygen atom bound to the carbon atom.

Advantageous Effects of Invention

The present invention is to provide a ball-point pen in which favorable writing can be obtained over a long distance and a long term.

DETAILED DESCRIPTION OF PREFERRED EMBODIMENTS

An embodiment of the writing instrument according to the present invention will be explained in detail below with reference to the drawings.

Figure 1:
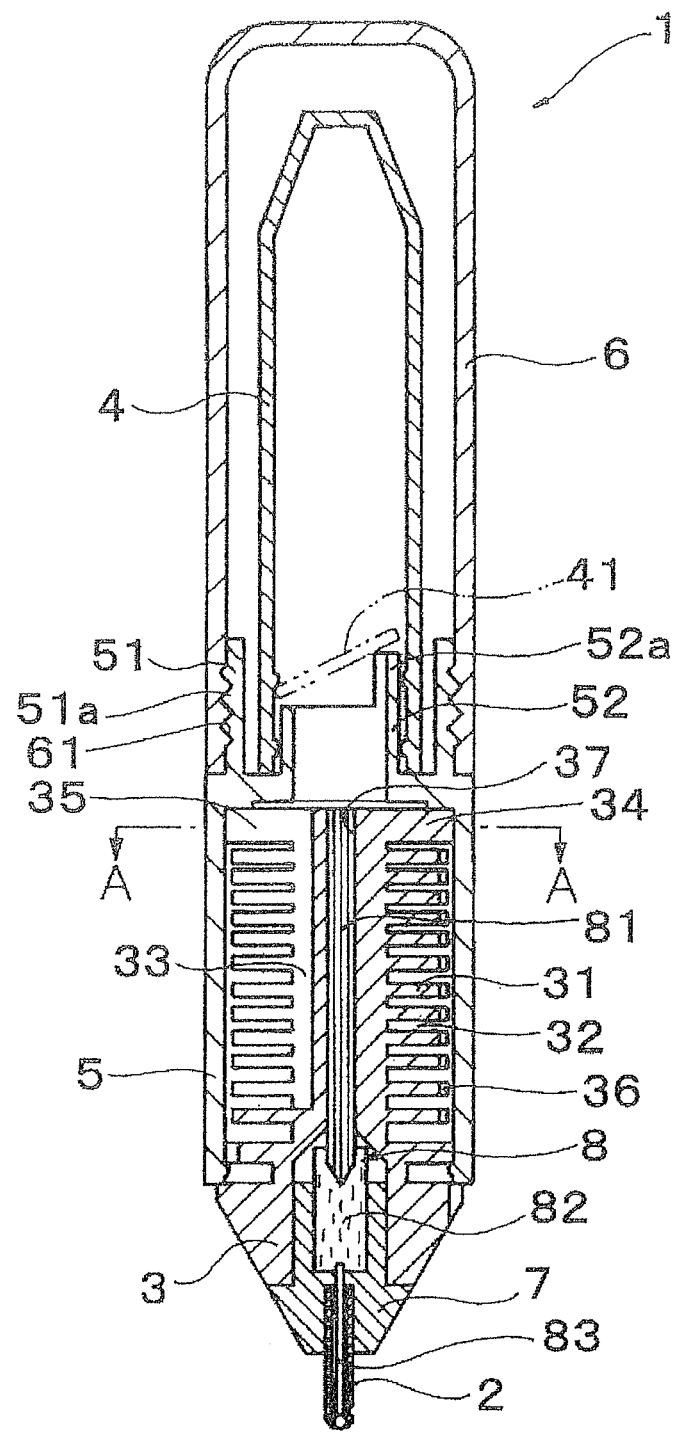
FIG. 1 is a longitudinal cross-sectional view of a writing instrument according to an embodiment of the present invention.

The cross-sectional view of the writing instrument according to one embodiment of the present invention is as illustrated in FIG. 1. The writing instrument 1 is a direct liquid type writing instrument, in which a pen point 2 and an ink tank 4 are attached to both ends of a pen point retaining member 3. On the pen point retaining member 3, combs 31 in which an ink effused due to the increase of the internal pressure of the ink tank 4 is temporarily retained are formed. Reservation grooves 32 and a guiding groove 33 are defined by the combs 31, so that the function of reserving an ink is exerted. The ink tank 4 is attached to a rear end side when the pen point side of the writing instrument 1 is regarded as a leading end side. In FIG. 1, the ink tank 4 is releasably attached without limitation. However, in the present invention, since the durability of a pen point portion is very high, the pen point portion can be used for a long term, and it is preferable that ink can be refilled. Therefore, the writing instrument according to the present invention is a writing instrument with an interchangeable ink tank.

The writing instrument 1 illustrated in FIG. 1 further includes a leading shaft 5 and a rear shaft 6. The leading shaft 5 accommodates the pen point retaining member 3, and a threaded engagement structure for releasably attaching the rear shaft 6 is disposed in the rear end portion thereof. A structure to which the ink tank 4 is releasably attached is disposed in the rear end side of the pen point retaining member accommodated in the leading shaft 5. In the writing instrument illustrated in FIG. 1, the rear end of the leading shaft 5 described below protrudes to form a cylindrical binding portion 52, to which the ink tank 4 is releasably connected. The ink tank 4 is accommodated in the rear shaft 6 by attaching the rear shaft 6. The pen point 2 is attached to the leading end of the pen point retaining member 3 via a holder 7. An ink is guided from the ink tank 4 to the pen point 2 by an ink guiding member 8 which penetrates the pen point retaining member 3.

Leading Shaft

The leading shaft 5 includes a cylindrical structure, of which both ends are opened, for example, a hollow cylinder, and is obtained by injection molding or the like of a synthetic resin (for example, polypropylene, polycarbonate, or the like). The rear end portion of the leading shaft 5 is provided with a cylindrical threaded engagement portion 51, of which the diameter is reduced, and the cylindrical binding portion 52 which is concentrically placed on the inside of the threaded engagement portion 51. A male screw portion 51a is formed on the outer surface of the threaded engagement portion 51. The binding portion 52 is pressed into the opening of the ink tank 4 when the ink tank 4 is attached. Furthermore, a projection 52a for backward pushing off a plug body 41 in the opening of the ink tank 4 to open the plug when the ink tank 4 is attached is formed in a part of the rear end of the binding portion 52.

Rear Shaft

The rear shaft 6 includes a bottomed cylindrical body, of which the leading end side is opened, and is obtained by injection molding or the like of a synthetic resin (for example, polypropylene, polycarbonate, or the like). A female screw portion 61 that can be threadedly engaged releasably with the male screw portion 51a of the threaded engagement portion 51 of the leading shaft 5 is formed on the inner peripheral surface of the leading end side opening of the rear shaft 6. Further, the rear shaft 6 preferably has transparency so that the amount of residual ink in the ink tank 4 can be viewed from the outside.

Pen Point Retaining Member

The pen point retaining member 3 is obtained by injection molding or the like of a synthetic resin (for example, ABS resin or the like). The pen point 2 and the ink tank 4 are attached to the pen point retaining member 3. In FIG. 1, the ink tank 4 is releasably attached while the pen point 2 is unreleasably attached. In other words, in the present invention, since the wear of the pen point is reduced by the combination of the specific pen point and the specific ink, there is no need for exchanging the pen point, and therefore, it is not necessary to allow the pen point to be releasable. However, the pen point can also be releasably attached to be intended to be used for a longer term.

In the present invention, the pen point retaining member 3 has the function of linking the ink tank to the pen point. In order to realize a higher writing property, the pen point retaining member is preferably provided with an ink reserving function. The writing instrument illustrated in FIG. 1 includes the pen point retaining member having the ink reserving function.

Figure 2:
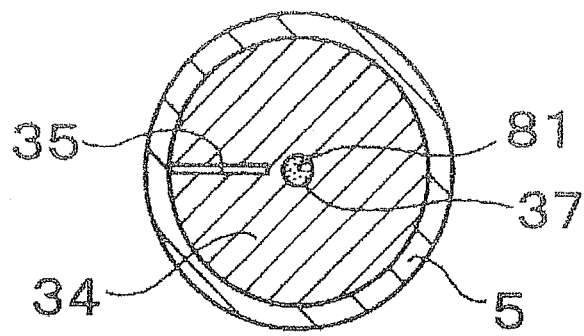
FIG. 2 is a cross-sectional view of the line A-A of FIG. 1.

The pen point retaining member 3 includes the plural combs 31 which are discoidal. The reservation grooves 32 for temporarily reserving an ink are formed mutually between the combs 31. The slit-like guiding groove 33 that is connected to each reservation groove 32 and extends in an axial direction is formed on the combs 31. A communication groove 35 which is connected to the guiding groove 33 and of which the side closer to the ink tank 4 is opened is installed to penetrate back and forth a collar portion 34 located at the rearmost end of the group of the combs 31 of the pen point retaining member 3 (see FIG. 2). Further, concave grooves 36 for circulating air are formed on the combs 31. Further, a central hole 37 is installed to penetrate the center of the pen point retaining member 3. A first ink guiding member 81 including an extrusion-molded body of a synthetic resin is attached by being inserted into the central hole 37.

The member having the ink reserving function of temporarily retaining an ink effused due to the increase of the internal pressure of the ink tank was described as an example of the pen point retaining member, but the pen point retaining member is not particularly limited thereto.

Ink Tank

In the writing instrument illustrated in FIG. 1, the ink tank 4 is obtained by injection-molding or the like of a synthetic resin (for example, polyethylene or the like). The ink tank 4 is generally a bottomed cylindrical body of which the leading end is opened and the rear end is closed, and in which the inner peripheral surface of the opening is provided with the plug body 41, which blockades the interior of the ink tank 4, by fitting, welding, adhering, or the like. An ink for a writing instrument is accommodated directly in the ink tank 4. The ink tank 4 preferably has transparency so that the amount of residual ink therein can be viewed. The ink tank that is a bottomed cylindrical body is illustrated in FIG. 1, but the ink tank is not limited thereto. In other words, the ink tank may be an ink accommodating tube of which a terminal portion is opened.

Although the direct liquid type writing instrument in which ink is accommodated directly in the ink tank is described as an example in FIG. 1, an inner cotton type writing instrument in which inner cotton is impregnated with ink is also acceptable.

Further, examples of the ink used in the writing instrument according to the present invention include water-based inks, water-based gel inks, oil-based inks, and the like, without particular limitation. However, a water-based ink with Newtonian viscosity and a water-based ink imparted with shear-thinning viscosity are preferred since the contact portion between the ball and the ball holding portion tends to become in boundary lubrication to be prone to be worn, and therefore, the effect of improvement in durability by the present invention is prominently produced. Furthermore, the viscosity of the ink used in the present invention is not also particularly limited, but the case of using an ink having a viscosity of less than 10 mPa·s (20° C.) in writing is also preferred since the effect of the present invention is similarly prominently produced.

Further, the ink used in the writing instrument according to the present invention includes a lubricating interface layer-forming compound. As used herein, the lubricating interface layer-forming compound is a compound having the action of forming a lubricating interface layer between the ball and the inner surface of the ball holding portion. This lubricating interface layer is a layer having the action of inhibiting the ball and the ball holding portion from coming into direct contact with each other and from being in boundary lubrication.

The lubricating interface layer-forming compound is not particularly limited if enabling the formation of a lubricating interface layer between the ball and the ball holding portion as described above, and specific examples thereof include an organic compound having an organic acid group or an organic acid residue.

In the present invention, the organic acid group is an organic acidic group such as, for example, carboxyl group (—COOH), phosphoryl group (—P(=O)(OH)$_2$), sulfo group (—SO$_3$H), sulfino group (—SO$_2$H), or hydroxyphenyl group (—C$_6$H$_4$OH). Of these, carboxyl group or phosphoryl group is preferred, and carboxyl group is particularly preferred. These groups exert superior wear prevention effects, and this is considered to be because these groups have particularly high affinities for a carbonaceous film (detailed below). Further, the organic acid residues are groups obtained by removing hydrogen from the organic acid groups, such as, for example, —COO—, —P(=O)(OH)O—, —P(=O)(O—)$_2$, —SO$_3$—, —SO$_2$—, and —C$_6$H$_4$O—. The organic acid residues are formed by reaction of the organic acid groups with other metal atoms or organic compounds such as alcohols. The lubricating interface layer-forming compound in the present invention may contain two or more groups of, or two or more kinds of the organic acid groups or the organic acid residues.

Further, an organic group bound to the organic acid group or the organic acid residue can be appropriately selected depending on an ink of interest and is not particularly limited. Such an organic group is generally a saturated or unsaturated hydrocarbon group, and for example, a lubricating interface layer-forming compound used in a water-based ink preferably has a substituent that enhancing water solubility because of desirably having high water solubility. Such substituents include hydroxyl group, ether group, carbonyl group, ketone group, amino group, amide group, alkyleneoxy group, acyl group, carboxyl group, ester group, phosphate group, sulfonate group, and the like. In other words, the organic acid group may also exert the function of enhancing water solubility.

Such lubricating interface layer-forming compounds include fatty acids, alkylbenzene sulfonic acids, phosphate esters, amino acids, N-acylamino acids, aliphatic amide alkylene oxide adducts, terpenoid acid derivatives, salts thereof, and the like. More specifically, preferred lubricating interface layer-forming compounds include oleic acid, stearic acid, linolic acid, linolenic acid, ricinoleic acid, dodecylbenzenesulfonic acid, polyoxyethylene alkyl ether phosphate ester, polyoxyethylene alkyl phenyl ether phosphate ester, alanine, glycine, lysine, threonine, serine, proline, sarcosine, N-acylsarcosine, polyoxyethylene fatty acid amide, salts thereof, and the like. These may also be used in combination of two or more kinds.

In the present invention, the lubricating interface layer-forming compound is considered to have the action of enhancing an affinity between the ink and the carbonaceous film. For example, there has been an ink used in a conventional ball-point pen, containing water and a component having a hydrophilic functional group, such as alcohol or glycol ether. The ink containing such a component has had a low affinity for a conventionally used ball, for example, a ball comprising silicon carbide, not subjected to surface treatment, and a contact portion between a ball and a ball holding portion has tended to be prone to be in boundary lubrication. However, in the present invention, the carbonaceous film having a carbon-oxygen bond is formed on either ball or ball holding portion, and it is easy to offer fluid lubrication between the ball and the ball holding portion by using an ink having a high affinity therefor. Therefore, the ink containing the lubricating interface layer-forming compound having a high affinity for the carbonaceous film having a carbon-oxygen bond is used to form the lubricating interface layer between the ball and the ball holding portion and to make it possible to enhance the effect of inhibiting the wear of the ball and the like. The reason why the lubricating interface layer is formed in such a manner is considered to be that when an uncombined hand of carbon exists on the surface of the carbonaceous film, the uncombined hand and the lubricating interface layer-forming compound are bound by a reaction such as chemical adsorption by the rotation of the ball, and the surface of the carbonaceous film is coated with the lubricating interface layer-forming compound to form a layer.

When the ink for a writing instrument is a water-based ink for a ball-point pen, the ink preferably has a pH of 7 to 13, more preferably a pH of 7 to 9. The ink is allowed to be alkaline or weak alkaline in such a manner, to obtain the dissolution stability of the lubricating interface layer-forming compound in the water-based ink for a ball-point pen and to further improve the temporal stability of the lubricating interface layer due to the adsorption of the functional group of the lubricating interface layer-forming compound on the surface of the carbonaceous film.

When the carbonaceous film is formed only on either ball or ball holding portion, a part that is not coated with the carbonaceous film is exposed. When the ink comes into contact with the exposed part, a metal component contained in the ball or the ball holding portion, for example, a metallic binding material used in the ball may be eluted with time. The eluted metal component is oxidized, becomes insoluble in the ink, and may adhere to the ball surface and the like. The elution and the adhesion may result in a defect such as the deterioration of surface smoothness, the inhibition of the rotation of the ball, and the heavier feeling of writing; the inhibition of the smooth outflow of the ink and patchy handwriting; or the like. In view of such facts, in consideration of the temporal stability of a ball-point pen, a pH adjuster such as a basic compound represented by an amine can be added particularly when a water-based ink for a ball-point pen is used. In this case, the adsorption of the lubricating interface layer-forming compound, which is generally acidic, to the surface of the carbonaceous film tends to be inhibited; however, since the deterioration of writing performance due to the elution of a metal component after a lapse of time can be suppressed, the temporal stability of the writing instrument may be able to be comprehensively improved.

Pen Point

The pen point 2 has a structure in which a ball 24 is rotatably held in the ball holding portion disposed in the leading end. Such a structure is also referred to as a ball-point pen tip. In the ball holding portion, the ball 24 is rotatably held by an inward leading edge 22 formed by radially inwardly press-deforming the taper-like leading end portion of a metallic pipe 21 (for example, a pipe comprising stainless steel, copper, aluminum, nickel, or the like), and by a plurality of (for example, three or four) inwardly projecting portions 23 formed by radially inwardly press-deforming a side wall in the vicinity of the leading end of the pipe. The plural inwardly projecting portions 23 are placed generally at an equal spacing circumferentially on the inner surface of the pipe 2. The ball is held by the extremely leading end portion 22 and the inwardly projecting portions 23 so as not to be removed from the pen point. The swaging angle of the leading edge 22 is generally allowed to be from 50° to 100° in consideration of an angle with respect to paper and an ink flow path.

Although the pipe-type ball-point pen tip formed by press-processing or the like of a pipe made of stainless steel is illustrated as an example in FIG. 1, a cutting-type ball-point pen tip formed by cutting and processing a stainless steel wire rod with a drill is also acceptable. Examples of the material of the ball 24 include sintered bodies of tungsten carbide, ceramics of zirconia, alumina, silica, silicon carbide, and the like, stainless steel described as examples, or the like.

As the material of the ball held by the pen point, which is not particularly limited, a material comprising a metal or a ceramic is generally used. Since durability is demanded in the writing instrument according to the present invention, it is preferable to select a material having a high hardness. For example, a ceramic such as tungsten carbide, zirconium oxide, aluminum oxide, silicon oxide, or silicon carbide, or a metal such as stainless steel is used. A cemented carbide alloy comprising a ceramic and a metallic binding material may also be used. As such a cemented carbide alloy, an alloy comprising tungsten carbide and a metallic binding material such as cobalt or nickel is known.

In the writing instrument illustrated in FIG. 1, the ball of tungsten carbide (equivalent to ISO K-10) having a diameter of 0.5 mm is used. The size of the ball is determined by the application of the writing instrument, the width of a drawn line demanded in writing, or the like, and is generally selected from the range of 0.25 to 2.0 mm. In the present invention, a more preferred effect can be exerted when the ball having a small diameter, for example, the small-diameter ball having a diameter of 0.5 mm or less is used. This is because in the case of writing of the same distance, the lower diameter of the ball results in the more rotation number of the ball and therefore in a tendency to more easily wear the ball holding portion.

Further, the clearance between the ball and the inner surface of the ball holding portion in the pen point greatly influences a writing property. Therefore, it is preferable to suitably adjust the clearance. The suitable clearance varies according to the viscosity of an ink for a writing instrument used, or the like. For example, in a case in which the ink for a writing instrument has a viscosity of less than 10 mPa·s, a sufficient consumption of ink is not obtained and there is the fear of patchy writing or the like when the clearance at a writing distance of 0 m (no use of the writing instrument) is too narrow, while there is the fear of dripping of the ink when the clearance is too wide. Therefore, the clearance is preferably 5 μm or more and 25 μm or less, more preferably 10 μm or more and 20 μm or less, most preferably 15 μm or more and 18 μm or less.

Carbonaceous Film

Figure 3:
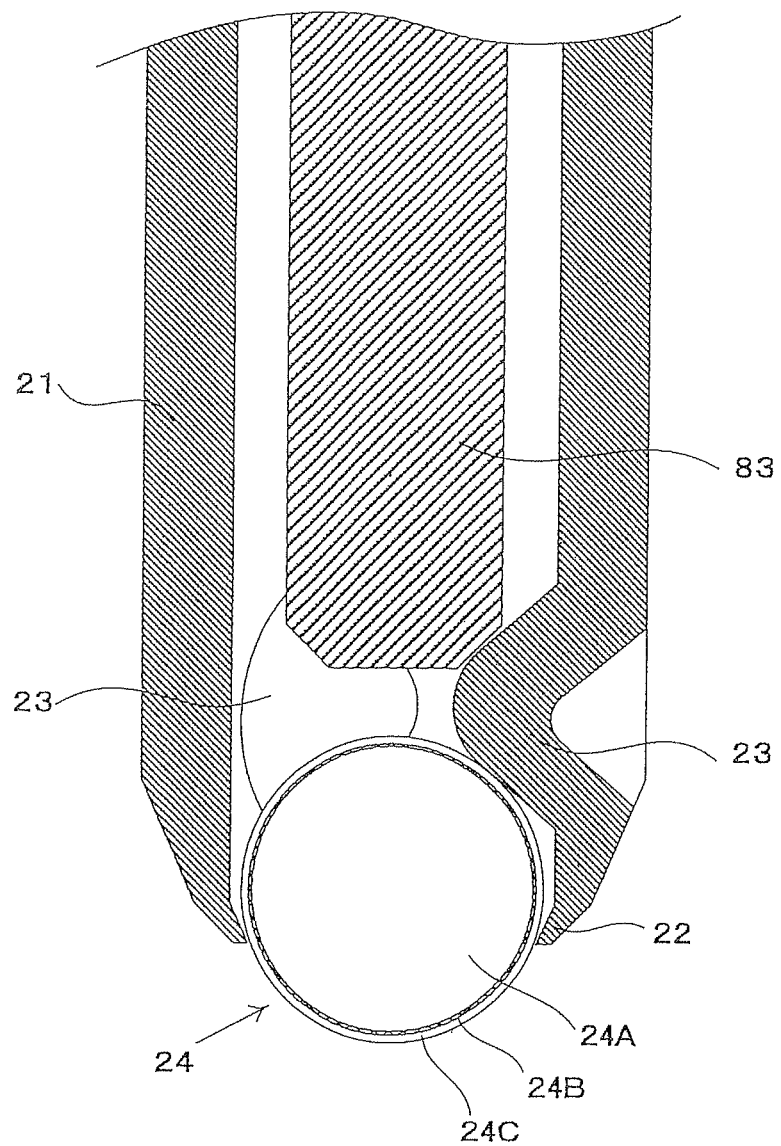
FIG. 3 is an enlarged vertical longitudinal sectional view of the principal portion of FIG. 1.

In the writing instrument according to the present invention, a carbonaceous film is formed on at least one of the surface of the ball or the contact portion of the ball holding portion with the ball. The carbonaceous film may be formed on both of the surface of the ball and the contact portion. In FIG. 3, an example in which a carbonaceous film 24C is formed on the surface of a ball body 24A via an intermediate layer 24B (detailed below) is illustrated. In the present invention, a material including the ball body 24A as well as the intermediate layer 24B and the carbonaceous film 24C may be referred to as the ball 24. When the carbonaceous film is formed on the ball holding portion, the carbonaceous film may be formed only on a part coming into contact with the ball, while the carbonaceous film may also be formed in a wider range than the actual contact part from the viewpoint of the easiness of production, deformation due to use, and the like. Furthermore, the carbonaceous film may be formed on the whole inner surfaces of the ball holding portion.

In the present invention, the carbonaceous film has a carbon atom and an oxygen atom bound to the carbon atom. Therefore, the durability of the ball or the ball holding portion is increased. In addition, since the carbonaceous film in the present invention has a high affinity for an ink, the ink is held in a gap between the ball and the interior of the ball holding portion, and direct contact between the ball and the ball holding portion is inhibited. As a result, the wearing of the ball and the interior of the ball holding portion due to the direct contact between the ball and the ball holding portion can be reduced, and the durability is further improved. In addition, since the deterioration of the feeling of writing due to use is inhibited by the improvement in durability, the need for exchanging the pen point is substantially eliminated, and a ball-point pen in which stable writing performance is satisfied for a long term can be realized. Further, when the carbonaceous film is formed on the ball surface, an affinity between the ball surface and ink is improved to thereby enable the stabilization of the supply of the ink to a contact portion between the ball and a paper surface during writing, therefore, more uniform handwriting and the favorable feeling of writing can be realized, and a writing property can be allowed to be favorable.

In the carbonaceous film, a carbon atom is bound to an oxygen atom in various forms. Specifically, a carbon atom and an oxygen atom are considered to be bound to each other in the forms of C—O, O=C—O, and C=O. It is considered that C—O mainly constitutes hydroxyl group, ethers, and the like, C=O mainly constitutes carbonyl group, ketones, and the like, and O=C—O mainly constitutes carboxyl group, esters, and the like in general. These bonds are considered to enhance an affinity for an ink. In addition, a carbon atom is bound to carbon or hydrogen in the form of C—C or C—H. Accordingly, the affinity between the carbonaceous film and the ink on the surface of the carbonaceous film is enhanced with increasing the rate (hereinafter referred to as $CO_{total}$) of bonds containing oxygen (C—O, O=C—O, and C=O) to all the bonds of carbon (C—O, O=C—O, C=O, C—C, and C—H). A value of $CO_{total}$ is preferably 0.1 or more and more preferably 0.15 or more since the affinity between the carbonaceous film and the ink is increased, and it is easy to maintain stable writing performance for a long term and over a long distance. In contrast, since the excessively high value of $CO_{total}$ tends to result in reduced bonds between carbon atoms and in decreased hardness, the value is preferably 0.5 or less and more preferably 0.45 or less.

In the present invention, the carbonaceous film can be formed on the ball surface or the contact portion of the ball holding portion with the ball by an optional method. The carbonaceous film may be formed on either or both of the ball surface or the ball holding portion. However, since the formation of the carbonaceous film on the ball surface results in the reduction of wear between the ball and the ball holding portion and in the stabilization of the supply of ink as described above, it is preferable to form the carbonaceous film on at least the ball surface.

A method of forming the carbonaceous film is not particularly limited. For example, the formation can be performed by a plasma chemical vapor phase deposition method (plasma CVD method), a catalytic chemical vapor phase deposition method (CAT-CVD method), or the like using hydrocarbon gas as a raw material. The formation can also be performed by a sputtering method, an arc ion plating method, or the like with solid graphite as a raw material. Furthermore, the formation may be performed by another method or by a combination of a plurality of methods.

The carbonaceous film used in the present invention is a film containing an $sp^2$ carbon-carbon bond (graphite bond) and an $sp^3$ carbon-carbon bond (diamond bond), which film is represented by a diamond like film (DLC film). A film in an amorphous state, such as a DLC film, or a film in a crystalline state, such as a diamond film, is acceptable. However, in the carbonaceous film in the present invention, a higher proportion of an $sp^3$ carbon-carbon bond to an $sp^2$ carbon-carbon bond is preferred since the hardness of the carbonaceous film is higher. Specifically, the proportion of the $sp^3$ carbon-carbon bond to the $sp^2$ carbon-carbon bond is preferably 0.3 or more. Further, it is presumed that when much $sp^3$ carbon exists in the carbonaceous film, the number of uncombined hands that exist in the surface of the carbonaceous film is relatively increased, the amount of lubricating interface layer-forming compound that reacts with the combined hands is thus increased, and a sufficient lubricating interface layer is formed.

Further, although the carbonaceous film typically contains an $sp^2$ carbon-hydrogen bond and an $sp^3$ carbon-hydrogen bond, a carbon-hydrogen bond is not an essential component in the carbonaceous film in the present invention. To the carbonaceous film, silicon (Si), fluorine (F), or the like may also be added in a range in which the effect of the present invention is not deteriorated.

Further, a method of introducing a carbon-oxygen bond into the carbonaceous film may be performed by irradiation with, for example, oxygen plasma, plasma of a gas containing oxygen, or the like. As the gas containing oxygen, water vapor, air, or the like can be used. A gas of an organic substance compound containing an oxygen atom, or the like can also be used. Furthermore, oxygen can also be introduced by irradiating the carbonaceous film with ultraviolet rays in an atmosphere containing oxygen or by immersing the carbonaceous film in an oxidative solution. When the carbonaceous film is formed, a carbon-oxygen bond can also be introduced by increasing the concentration of oxygen in an atmosphere when the carbonaceous film is formed. Just after the formation of the carbonaceous film, an uncombined hand exists on the surface thereof. Therefore, the uncombined hand can also be allowed to react with oxygen to introduce a carbon-oxygen bond by leaving the carbonaceous film, just after having been formed, standing in an atmosphere containing oxygen. A carbon atom with an uncombined hand may also exist if a carbon-oxygen bond is introduced.

The film thickness of the carbonaceous film is not particularly limited but preferably ranges from 0.001 µm to 3 µm, more preferably ranges from 0.005 µm to 1 µm. Further, the carbonaceous film can be formed directly on the surface of the ball or the ball holding portion; however, in order to allow the ball or the ball holding portion and the carbonaceous film to more firmly adhere to each other, it is preferable to dispose an intermediate layer. As the material of the intermediate layer, various materials can be used depending on the kind of the ball or the ball holding portion, and, for example, a known material such as an amorphous film comprising silicon (Si) and carbon (C), titanium (Ti) and carbon (C), or chromium (Cr) and carbon (C) can be used. The thickness thereof is not particularly limited but preferably ranges from 0.001 µm to 0.3 µm and more preferably ranges from 0.005 µm to 0.1 µm. The intermediate layer can be formed by using, for example, a sputtering method, a CVD method, a plasma CVD method, a spraying method, an ion plating method, an arc ion plating method, or the like.

The pen point 2 is attached to the front of the holder 7. In addition, the rear of the holder 7 is pressed into the leading end opening of the central hole 37 of the ink retaining member 3. In other words, the pen point 2 is attached to the ink retaining member 3 via the holder 7. The holder 7 includes a collar-like front, to which the pen point 2 is attached, and a rear pressed into the leading end opening of the central hole 37 of the ink retaining member 3. The holder 7 is obtained by injection-molding or the like of a synthetic resin or the like.

The ink guiding member 8 includes the first ink guiding member 81, a second ink guiding member 82, and a third ink guiding member 83. The second ink guiding member 82 including a fiber-processed body is accommodated in the rear of the holder 7. The third ink guiding member 83 which guides ink to the rear face of the ball 24 and includes an extrusion-molded body of a synthetic resin is accommodated in the pen point 2. The rear end of the third ink guiding member 83 intrudes into and is connected to the leading end of the second ink guiding member 82, while the leading end of the first ink guiding member 81 intrudes into and is connected to the rear end of the second ink guiding member 82. The third ink guiding member 83 is allowed to abut on the inner surface (rear inner surface) of each inwardly projecting portion 23.

Method for Forming Carbonaceous Film

In the writing instrument according to the present invention, the carbonaceous film is formed on at least one of the ball or the ball holding portion. A method of forming a carbonaceous film will be explained below. As an example, a method of forming a carbonaceous film on a ball surface will be explained. A similar method can also be applied to the case of forming a carbonaceous film on a ball holding portion.

Prior to the formation of the carbonaceous film on the ball surface, an intermediate layer can be formed. The case of forming an intermediate layer including an amorphous film containing Si and C on the surface of the ball will be explained. For the film formation of the intermediate layer, for example, an ionic vapor deposition method can be used. In the method, the interior of a chamber for ionized deposition is adjusted to predetermined pressure using a vacuum pump, tetramethylsilane ($Si(CH_3)_4$) is introduced into the chamber, and a bias voltage (for example, 1 kV) is applied to the ball to cause discharge (for, e.g., 30 minutes). The intermediate layer can be formed on the whole surface of the ball by rotating the ball in the chamber when the film is formed.

After the formation of the intermediate layer, the gas supplied into the chamber is switched to benzene to form the carbonaceous film. The interior of the chamber is adjusted to predetermined pressure using a vacuum pump, and a bias voltage (for example, 1 kV) is thereafter applied to the ball to cause discharge (for, e.g., 90 minutes). The carbonaceous film can be formed on the whole surface of the ball by rotating the ball in the chamber when the film is formed.

Thereafter, plasma irradiation is optionally performed in an atmosphere containing oxygen to introduce a carbon-oxygen bond into the carbonaceous film. Plasma irradiation is performed at a pressure adjusted to, for example, 100 Pa in the chamber and at an output of, for example, 10 W, whereby the ball of interest can be obtained.

The rate of the carbon-oxygen bond contained in the obtained carbonaceous film can be evaluated by X-ray photoelectron spectroscopy (XPS) measurement. Measurement conditions are adjusted depending on the kind, thickness, and the like of a carbonaceous film to be formed, for example, a detection angle with respect to a sample can be 90°, Al can be used as an X-ray source, and X-ray irradiation energy can be 100 W. Time of one measurement is generally around 0.1 ms. Further, in order to enhance measurement accuracy, measurement of one sample may be performed several times, for example, 64 times to regard the average value thereof as a measurement result.

In order to determine the rates of C—O, C═O, and O═C—O in the carbonaceous film, a carbon 1s (C1s) peak obtained by the XPS measurement is decomposed, by curve fitting, into seven components of $sp^3$ C—C and $sp^2$ C—C in which carbon and carbon are bound to each other, $sp^3$ C—H and $sp^2$ C—H in which carbon and hydrogen are bound, and C—O, C═O, and O═C—O in which carbon and oxygen are bound. It is appropriate for the curve fitting to allow the bond energy of $sp^3$ C—C to be 283.8 eV, the bond energy of $sp^2$ C—C to be 284.3 eV, the bond energy of sp$^3$ C—H to be 284.8 eV, the bond energy of sp$^2$ C—H to be 285.3 eV, the bond energy of C—O to be 285.9 eV, the bond energy of C═O to be 287.3 eV, and the bond energy of O═C—O to be 288.8 eV. A value obtained by dividing the area of each peak obtained by the curve fitting by the overall area of the C1s peak is regarded as the composition ratio of each component. The sum of the composition ratios of C—O, C═O, and O═C—O is regarded as the rate (CO$_{total}$) of carbon-oxygen-bound carbon atoms to the total carbon atoms.

The thicknesses of the intermediate layer and the carbonaceous film can be measured by analyzing the ball, on which the carbonaceous film is formed, with an Auger electron spectroscopy device (PHI-660 Type (trade name), manufactured by ULVAC-PHI, Inc.). Specifically, the surface of the ball on which the carbonaceous film is formed is etched in stages, and the surface is analyzed at each stage by an Auger electron spectroscopy analysis method. As measurement conditions, for example, the acceleration voltage of an electron gun is set at 10 kV, a sample current is set at 500 nm, and the acceleration voltage of an argon ion gun is set at 2 kV. A region measuring 40 µm per side on the ball surface is analyzed at each depth under the measurement conditions, whereby the thicknesses of the intermediate layer and the carbonaceous film can be measured.

When a ball with a carbonaceous film produced by the method was analyzed, the following results were obtained. In the depth from the surface of the ball, on which the carbonaceous film was formed, to around 80 nm, only carbon atoms (C) substantially existed, and the carbonaceous film was formed. In the depth of 80 nm to 120 nm, Si atoms existed, and an intermediate layer comprising SiC was formed. In the portion having a depth of 100 nm or more, only tungsten carbide (WC) was detected, and the intermediate layer and the carbonaceous film were confirmed to be formed on the surface of the tungsten carbide which was the ball.

EXAMPLE

A ball (DLC-1) on the ball surface of which a carbonaceous film was formed and a ball (DLC-2) in which a carbonaceous film in which the rate of carbon-oxygen bond was varied by changing plasma irradiation conditions was obtained were produced by the method. Specifically, DLC-1 was irradiated with oxygen plasma for 60 seconds at an output of 10 W from a high frequency power source. DLC-2 was irradiated with oxygen plasma for 60 seconds at an output of 50 W from the high frequency power source. The rate of each bond contained in the carbonaceous films formed on the balls was measured by the method. The obtained results are as listed in Table 1.

TABLE 1

| | C—C + C—H | C—O | C═O | O═C—O | CO$_{total}$ | $\frac{sp^3 C—C}{sp^2 C—C}$ |
|---|---|---|---|---|---|---|
| DLC-1 | 0.84 | 0.13 | 0.02 | 0.01 | 0.16 | 0.39 |
| DLC-2 | 0.57 | 0.21 | 0.13 | 0.09 | 0.43 | 0.42 |

The proportions (CO$_{total}$) of carbon atoms bound to oxygen atoms with respect to the total carbon atoms in DLC-1 and DLC-2 were 0.16 and 0.43, respectively. The value of CO$_{total}$ in DLC-2 with the higher power output in the irradiation with oxygen plasma was higher than that in DLC-1. CO$_{total}$ is further detailed as follows: the proportions of C—O to the total carbon in DLC-1 and DLC-2 were similar, while the proportion of C═O in DLC-2 was about 6 times that in DLC-1, and the proportion of O═C—O in DLC-2 was about 9 times that in DLC-1. Further, the proportions of sp$^3$ carbon-carbon bonds to sp$^2$ carbon-carbon bonds in the carbonaceous films were 0.3 or more.

Then, a contact angle between the surface of each ball of a tungsten carbide ball (WC) on which no carbonaceous film was formed, DLC-1 described above, or DLC-2 described above, and an ink for a writing instrument was measured. The measurement was performed using, as an ink for a writing instrument, a blue ink comprising 5.0 mass % of a blue dye (WATER BLUE 105S (trade name), manufactured by ORIENT CHEMICAL INDUSTRIES CO., LTD.), 0.5 mass % of a lubricating interface layer-forming compound (phosphate ester (PLYSURF AL (trade name), manufactured by DKS Co. Ltd.)), 1.0 mass % of triethanolamine, 5.0 mass % of diethylene glycol, 3.0 mass % of 2-pyrrolidone, and 85.5 mass % of water. When the viscosity of the ink was measured using a B type viscometer ((BL ADAPTOR) manufactured by TOKYO KEIKI INC.), the viscosity of the ink was 2 mPa·s under an environment of 20° C. In addition, the pH thereof was 9.0.

As for a contact angle between the surface of each ball and the ink for a writing instrument, in comparison with the contact angle of the untreated WC ball, the contact angle of DLC-1 is less, the contact angle of DLC-2 is further less, and the affinities thereof are high. It is clear that an affinity for an ink for a writing instrument is improved by forming a carbonaceous film having a carbon-oxygen bond.

For the measurement of a contact angle, an automatic contact angle measuring machine (DM-500 (trade name) manufactured by Kyowa Interface Science Co., Ltd.) was used. Dropwise addition of 1 µl of the water-based ink onto the surface of a test plate (WC, equivalent to ISO K-10) having a carbonaceous film disposed under the same conditions as those of the carbonaceous film disposed on the ball was performed to measure a contact angle. The timing of the measurement was just after the dropwise addition, and the measured value was an average value at three points. In the case of an ink having a comparatively high viscosity, for example, in the case of a water-based gel ink or an oil-based ink, the contact angle can be determined by measurement performed 3 seconds after the dropwise addition (measured value was an average value at three points).

The surface tension of the water-based ink was 40 mN/m. The surface tension of an ink is preferably 20 mN/m or more and 40 mN/m or less, most preferably 25 mN/m to 35 mN/m, under an environment at 20° C. so that the ink is smoothly supplied when an ink tank is exchanged. As a method for measuring the surface tension, the surface tension can be determined by measurement by a vertical plate method using a glass plate, under an environment at 20° C., using a surface tension measuring instrument manufactured by Kyowa Interface Science Co., Ltd.

Then, a writing implement including each ball described above was prepared to conduct a running test. The test is a test in which a writing instrument is retained in the state of being tilted at 70° with respect to a paper surface and is rotated to draw a circle having a diameter of 32 mm at a load of 100 gf (about 0.98 N), and a writing distance by the writing instrument is investigated using a tester that moves writing paper (JIS: P3201) at a speed of 4 m/min. Writing of a distance of about 10 cm is achieved by drawing one circle by the writing instrument. A distance from the leading end of a pen point to the leading end position of the ball was measured every 100 m of the writing distance. Since the distance from the leading end of the pen point to the leading end position of the ball was shortened due to wear of the ball and the ball holding portion, the change amount (depression amount) of the leading end position of the ball was regarded as a wear amount. Further, after the exhaustion of the ink filled in the ink tank, the ink tank was exchanged, and the running test was further continued.

As a result of measuring the wear amount mentioned above, the result of untreated ball (WC) on which no carbonaceous film was formed>carbonaceous film (DLC-0) into which no carbon-oxygen bond was introduced>DLC-1>DLC-2 was obtained. This is considered to be because, when the carbonaceous film having a carbon-oxygen bond was formed, an affinity between the ball and the water-based ink was improved, direct contact between the ball and the ball holding portion hardly occurs, and therefore, the ball and the ball holding portion were inhibited from being worn, although boundary lubrication is considered to occur between the ball and the ball holding portion in the water-based ink. Further, DLC-0 resulted in a large wear amount and in non-uniform handwriting in the writing of 2000 m. In contrast, in DLC-1 and DLC-2, stable writing performance was able to be maintained even in the writing of 3000 m and 5000 m.

The specific change amount (depression amount) of the leading end position of the ball in DLC-1 was 0 μm in non-writing, 3 μm after 0-100 m writing, 4 μm after 500 m writing, or 4 μm after 1000 m writing. As a result of further exchanging a cartridge and performing continuous measurement, the amount was 5 μm after 1500 m writing, 5 μm after 2000 m writing, 6 μm after 3000 m writing, or 6 μm after 5000 m writing. Depending on the composition and viscosity of an ink, uniform handwriting is inhibited when the change amount (depression amount) of the leading end position of the ball is more than 10 μm.

In DLC-1, a wear amount of 3 μm after 0-100 m writing is slightly large; however, since this is because the ball and the ball holding portion conform to each other to form an abutting surface from a writing distance of 0 m to a writing distance of 100 m, and then, wear does not occur or only slight wear occurs due to the carbonaceous film, stable writing performance is satisfied for a long period.

As a result of measuring a wear amount by the method mentioned above using, as the water-based ink for a writing instrument, a water-based ink (pH 9.0) comprising 40.0 mass % of a water soluble dye (WATER BLACK 191L (trade name), manufactured by ORIENT CHEMICAL INDUSTRIES CO., LTD.), 1.0 mass % of sarcosine (lubricating interface layer-forming compound), 1.0 mass % of triethanolamine (pH adjuster), 5.0 mass % of ethylene glycol, and 53.0 mass % of water, the result of untreated ball (WC) on which no carbonaceous film was formed>carbonaceous film (DLC-0) into which no carbon-oxygen bond was introduced>DLC-1>DLC-2 was obtained.

As a result of conducting a running test at a load of 400 gf by the method mentioned above using, as the oil-based ink for a writing instrument, an oil-based ink comprising 20.0 mass % of a dye (SPILON BLACK GMH-SPECIAL (trade name), manufactured by Hodogaya Chemical Co., Ltd.), 18.0 mass % of a dye (VALIFAST VIOLET 1701 (trade name), manufactured by ORIENT CHEMICAL INDUSTRIES CO., LTD.), 23.0 mass % of benzyl alcohol, 32.0 mass % of ethylene glycol monophenyl ether, 2.0 mass % of oleic acid (lubricating interface layer-forming compound), 2.0 mass % of NYMEEN L-201 (trade name, manufactured by NOF CORPORATION), 0.5 mass % of polyvinyl pyrrolidone (agent for imparting stringiness), and 2.5 mass % of a viscosity modifier (HILACK 110H (trade name), manufactured by Hitachi Chemical Company, Ltd.), to measure a wear amount, the result of untreated ball (WC) on which no carbonaceous film was formed>carbonaceous film (DLC-0) into which no carbon-oxygen bond was introduced>DLC-1>DLC-2 was obtained. When the viscosity of the ink was measured using a B type viscometer (manufactured by TOKYO KEIKI INC.), the viscosity of the ink was 1500 mPa·s under an environment of 20° C.

As a result of conducting a running test at a load of 400 gf by the method mentioned above using the oil-based ink, to measure a wear amount, the result of untreated ball (WC) on which no carbonaceous film was formed>carbonaceous film (DLC-0) into which no carbon-oxygen bond was introduced>DLC-1>DLC-2 was obtained.

REFERENCE SIGNS LIST

1 Writing instrument
2 Pen point
21 Pipe
22 Leading edge
23 Inwardly projecting portion
24 Ball
24A Ball body
24B Intermediate layer
24C Carbonaceous film
3 Ink reservoir member
31 Comb
32 Reservation groove
33 Guiding groove
34 Collar portion
35 Communication groove
36 Concave groove
37 Central hole
4 Ink tank
41 Plug body
5 Leading shaft
51 Threaded engagement portion
51a Male screw portion
52 Binding portion
52a Projection
6 Rear shaft
61 Female screw portion
7 Holder
8 ink guiding member
81 First ink guiding member
82 Second ink guiding member
83 Third ink guiding member

The invention claimed is:
1. A writing instrument comprising:
a pen point retaining member;
a pen point that comprises a ball and a ball holding portion that rotatably holds the ball, and is attached to a first end of the pen point retaining member;
an ink tank that is releasably attached to a second end of the pen point retaining member; and
an ink that is accommodated in the ink tank and comprises a lubricating interface layer-forming compound,
wherein a carbonaceous film is formed on at least one of a surface of the ball or a contact portion of the ball holding portion with the ball, the carbonaceous film comprising a carbon atom and an oxygen atom bound to the carbon atom,
and wherein surface tension of the ink is between 20 mN/m and 40 mN/m in an environment at 20° C.

2. The writing instrument according to claim 1, wherein the carbonaceous film is formed on both of the surface of the ball and the contact portion of the ball holding portion with the ball.

3. The writing instrument according to claim 1, wherein the ball is selected from the group consisting of metals, ceramics, and alloys thereof.

4. The writing instrument according to claim 1, wherein a proportion of an $sp^3$ carbon-carbon bond to an $sp^2$ carbon-carbon bond, contained in the carbonaceous film, is 0.3 or more.

5. The writing instrument according to claim 4, wherein a rate of a bond containing oxygen to the total bond of carbon contained in the carbonaceous film is 0.1 or more and 0.5 or less.

6. The ball-point pen according to claim 1, wherein the carbonaceous film is formed on the surface of the ball or the contact portion of the ball holding portion with the ball via an intermediate layer, and the intermediate layer comprises carbon and silicon.

7. The writing instrument according to claim 1, wherein the lubricating interface layer-forming compound is an organic compound comprising an organic acid group or an organic acid residue.

8. The writing instrument according to claim 7, wherein the organic acid group is carboxyl group.

9. The writing instrument according to claim 1, wherein the pen point is unreleasably attached to the pen point retaining member.

\* \* \* \* \*